United States Patent
Niiyama et al.

(10) Patent No.: US 8,402,329 B2
(45) Date of Patent: Mar. 19, 2013

(54) SCAN TEST CIRCUIT, AND METHOD AND PROGRAM FOR DESIGNING SAME

(75) Inventors: Keitarou Niiyama, Kanagawa (JP); Noriyuki Sakano, Kanagawa (JP); Yuuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 344 days.

(21) Appl. No.: 12/789,594

(22) Filed: May 28, 2010

(65) Prior Publication Data

US 2010/0318862 A1 Dec. 16, 2010

(30) Foreign Application Priority Data

Jun. 16, 2009 (JP) ................. 2009-143585

(51) Int. Cl.
*G01R 31/28* (2006.01)
(52) U.S. Cl. .......... 714/726; 714/724; 714/736
(58) Field of Classification Search .......... 714/726, 714/727, 731, 736, 738, 724
See application file for complete search history.

(56) References Cited

U.S. PATENT DOCUMENTS

| 3,300,757 | A | * | 1/1967 | Beltz | 382/202 |
| 4,588,944 | A | * | 5/1986 | Rothenberger | 714/731 |
| 5,859,657 | A | * | 1/1999 | Donahue et al. | 347/237 |
| 5,886,901 | A | * | 3/1999 | Magoshi | 716/113 |
| 6,173,428 | B1 | * | 1/2001 | West | 714/727 |
| 7,650,549 | B2 | * | 1/2010 | Branch et al. | 714/731 |

FOREIGN PATENT DOCUMENTS

| JP | 3239009 | 10/1991 |
| JP | 9320290 | 12/1997 |
| JP | 2005-069931 | 3/2005 |

* cited by examiner

*Primary Examiner* — Fritz Alphonse
(74) *Attorney, Agent, or Firm* — Young & Thompson (57) ABSTRACT

Flip-flops 201 to 206 constitute a scan path shift register. During shift mode operation, a clock signal CLK is supplied to clock terminals of the flip-flops 201, 203, and 205, a signal obtained by having an inverted clock control circuit 303 reverse the phase of the clock signal CLK is supplied to clock terminals of the flip-flops 202 and 206, and a normal/inverted clock control circuit 404 supplies a signal having the same phase as the clock signal CLK to a clock terminal of the flip-flop 204 having no sufficient setup time.

14 Claims, 8 Drawing Sheets

SCAN TEST CIRCUIT, AND METHOD AND PROGRAM FOR DESIGNING SAME

CROSS-REFERENCE TO RELATED APPLICATION

This application is based upon and claims the benefit of the priority of Japanese patent application No. 2009-143585 filed on Jun. 16, 2009, the disclosure of which is incorporated herein in its entirety by reference thereto.

TECHNICAL FIELD

The present invention relates to a scan test circuit, and method and program for designing same, and particularly to a technology for speeding up scan shift operation.

BACKGROUND

As a method for testing a semiconductor integrated circuit, scan test is known. The scan test is performed by having a scan test circuit (also simply known as "scan circuit") constituted by a shift register take in test data in parallel (sample mode operation and scan capture operation), serially shift the test data taken in, and output the result (shift mode operation and scan shift operation).

In recent years, the test time required to perform a scan test has increased due to an increase in the circuit scale of semiconductor integrated circuits. As a result, the reduction of the test time is demanded to reduce costs. In order to shorten the test time required to perform a scan test, it is preferable that the frequency of a clock signal that drives the shift register during the shift mode operation be raised. However, if one continues to raise the frequency of the clock signal, the current consumption will increase and the possibility that the operation will be gradually destabilized will increase since a high-frequency clock signal will be supplied.

In order to solve the problem above, a technology that makes the frequency of the clock signal into half by disposing flip-flops constituting a shift register alternately between a flip-flop operating on the rising edge of the clock signal and a flip-flop operating on the falling edge of the clock signal, and having them shift-operate is known (refer to Patent Documents 1 to 3). According to such a technology, the current consumption can be reduced and the operational stability increases since adjacent flip-flops operate on clock edges different from each other.

[Patent Document 1] Japanese Patent Kokai Publication No. JP-P2005-69931A
[Patent Document 2] Japanese Patent Kokai Publication No. JP-A-9-320290
[Patent Document 3] Japanese Patent No. JP2576657B

SUMMARY

The entire disclosures of the above patent documents are incorporated herein by reference thereto. The following analysis is given by the present inventor.

If one continues to raise the frequency of the clock signal that drives the shift register, among the flip-flops constituting the shift register, a flip-flop that does not have much setup time will suffer from shortage in sufficient setup time, the operation will be destabilized, and accurate data will not be transmitted. Furthermore, it will be impossible to increase the speed of the scan shift operation further. Thus there is much to be desired in the art.

According to a first aspect of the present invention, there is provided a scan test circuit which comprises a scan path shift register; and a clock signal supplying unit capable of supplying scan shift clock signals shifted by a half cycle to each of two adjacent flip-flops of flip-flops constituting the shift register, and of further supplying clock signals shifted by a cycle to each of at least a pair of adjacent flip-flops of the flip-flops, during shift mode operation.

A method for designing a scan test circuit relating to another aspect of the present invention comprises configuring so as to supply scan shift clock signals shifted by a half cycle to each of two adjacent flip-flops constituting a scan path shift register, confirming whether or not the flip-flops have sufficient setup time during scan shift operation, and inserting a normal/inverted clock control circuit that generates a clock signal for controlling the shift operation of a flip-flop of which the setup time is insufficient and replacing the control signal for the flip-flop of which the setup time is insufficient with an output of the normal/inverted clock control circuit when there is at least one flip-flop of which the setup time is insufficient.

A program relating to yet another aspect of the present invention has a computer constituting a circuit design apparatus execute configuring so as to supply scan shift clock signals shifted by a half cycle to each of two adjacent flip-flops constituting a scan path shift register, confirming whether or not the flip-flops have sufficient setup time during scan shift operation, and inserting a normal/inverted clock control circuit that generates a clock signal for controlling the shift operation of a flip-flop of which the setup time is insufficient and replacing the control signal for the flip-flop of which the setup time is insufficient with an output of the normal/inverted clock control circuit when there is at least one flip-flop of which the setup time is insufficient.

The meritorious effects of the present invention are summarized as follows.
According to the present invention, the speed of the scan shift operation can be increased further.

PREFERRED MODES

A scan test circuit relating to a mode of the present invention comprises a scan path shift register, and a clock signal supplying unit capable of supplying scan shift clock signals shifted by a half cycle to each of two adjacent flip-flops constituting the shift register, and of further supplying clock signals shifted by a cycle to each of at least a pair of adjacent flip-flops, during the shift mode operation.

In the scan test circuit, it is preferable that the clock signal supplying unit be configured so as to be capable of alternately supplying a clock signal having a positive phase and a clock signal having an opposite phase to each of the flip-flops, and of further supplying a clock signal having the same phase to at least three consecutive flip-flops.

In the scan test circuit, it is preferable that the clock signal supplying unit comprise a shift register that holds determination data determining whether the clock signal supplied to the flip-flops has a positive phase or an opposite phase thereof, and control supply of the clock signal based on the held determination data.

In the scan test circuit, it is preferable that the shift register be configured so that the determination data can be set externally.

In the scan test circuit, it is preferable that the clock signal supplying unit be capable of supplying a clock signal having the same phase to each of the flip-flops during the sample mode operation.

The scan test circuit described above is able to solve the problem in the conventional technology that the speed of the scan shift operation can be increased only to the extent that the setup time will not be insufficient. The reason is that it becomes possible to switch the operation of a flip-flop without sufficient setup time for the scan shift operation from a half-cycle operation to a one-cycle operation by inserting a control circuit capable of controlling both the normal and inverted clock signals (the positive-phase clock signal/opposite-phase clock signal) for the flip-flops without sufficient setup time. As a result, a margin of a half cycle's worth of setup time is added to the flip-flop without sufficient setup time, and a margin of the setup time increases. Although the flip-flop switched to a one-cycle operation operates at low speed, the other flip-flops can increase the speed of the scan shift operation. As a result, the speed of the scan shift operation can be increased further for the entire scan test circuit, compared to the conventional technology.

Further, the scan test circuit described above can be also applied to a semiconductor integrated circuit that does not have many terminals. The reason is that, in a case where there is a plurality of flip-flops without sufficient setup time for the scan shift operation, the clock signal for a plurality of flip-flops can be controlled without increasing the number of terminals that control a non-inversion/inversion control circuit by providing the shift register that holds the determination data judging the clock signal.

The scan test circuit described above may be designed using the following design method. Further, a program having a computer constituting a circuit design apparatus execute the design method below may be provided.

A scan test circuit design method relating to a mode of the present invention includes configuring a scan test circuit so as to supply scan shift clock signals shifted by a half cycle to each of two adjacent flip-flops constituting a scan path shift register; confirming whether or not flip-flops have sufficient setup time during the scan shift operation; and inserting a normal/inverted clock control circuit that generates a clock signal adapted to control shift operation of a flip-flop without sufficient setup time, and replacing the control signal for the flip-flop without sufficient setup time with an output of the normal/inverted clock control circuit, when there is at least one flip-flop without sufficient setup time.

It is preferable to include: inserting a shift register that holds control information for the normal/inverted clock control circuit before replacing the control signal when there is a plurality of flip-flops without sufficient setup time in the confirmation.

It is preferable to further include performing timing verification again after a layout of the scan test circuit has been completed, and a step of modifying the output of the normal/inverted clock control circuit based on the results of the timing verification.

The present invention will be described in detail using exemplary embodiments with reference to the drawings.

Exemplary Embodiment 1

Figure 1:
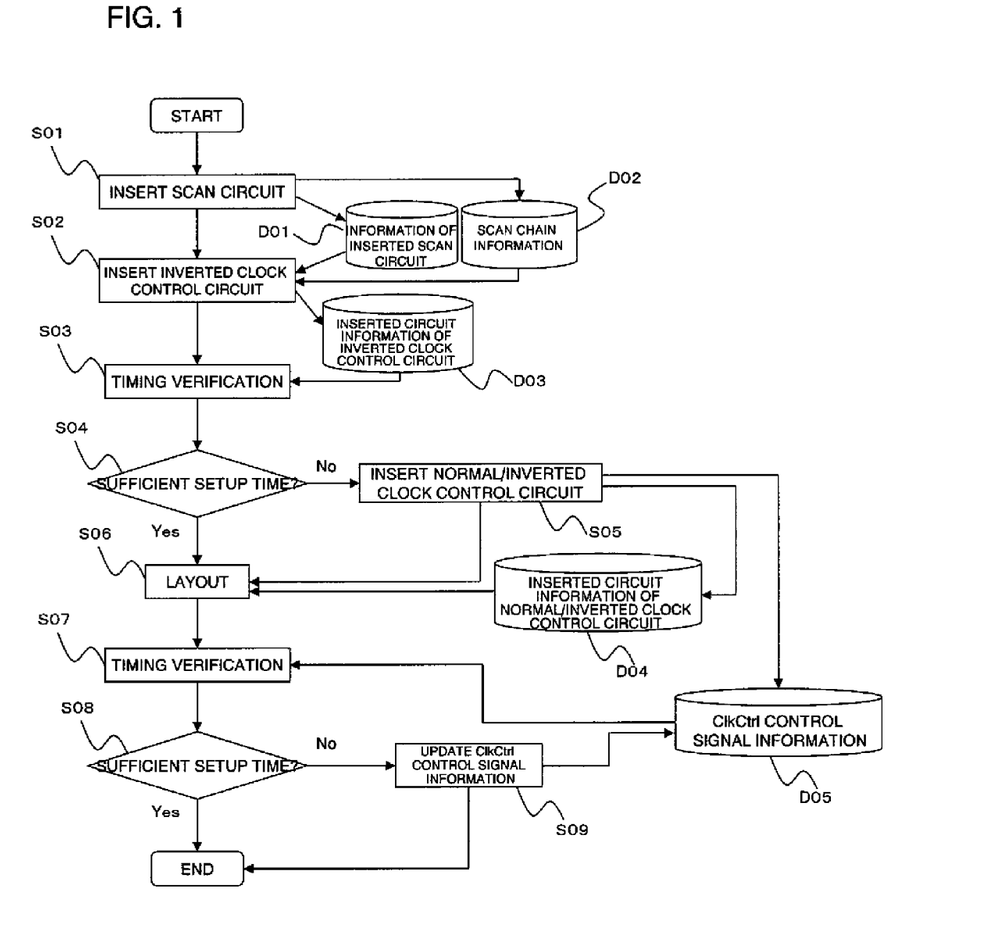
FIG. 1 is a flowchart showing a scan test circuit design method relating to a first exemplary embodiment.

FIG. 1 is a flowchart showing a scan test circuit design method relating to a first exemplary embodiment of the present invention. The present design method includes scan circuit inserting step S01 that inserts a scan circuit, inverted clock control circuit inserting step S02 that changes the control clock signal for the scan circuit so as to control alternately between normal/inverted clock signals, timing confirmation step S03 that confirms the timing after the insertion of the scan circuit, step S04 that determines whether or not the setup time is sufficient according to the timing confirmation results, inverted/normal clock control circuit inserting step S05 that changes the control of the scan circuit with insufficient setup time over to a third clock signal, layout step S06 that performs layout processing, timing confirmation step S07 that confirms the timing after the layout processing, step S08 that determines whether or not the setup time is sufficient, and step S09 that updates ClkCtrl control signal information when the setup time is determined to be insufficient in step S08.

Figure 2:
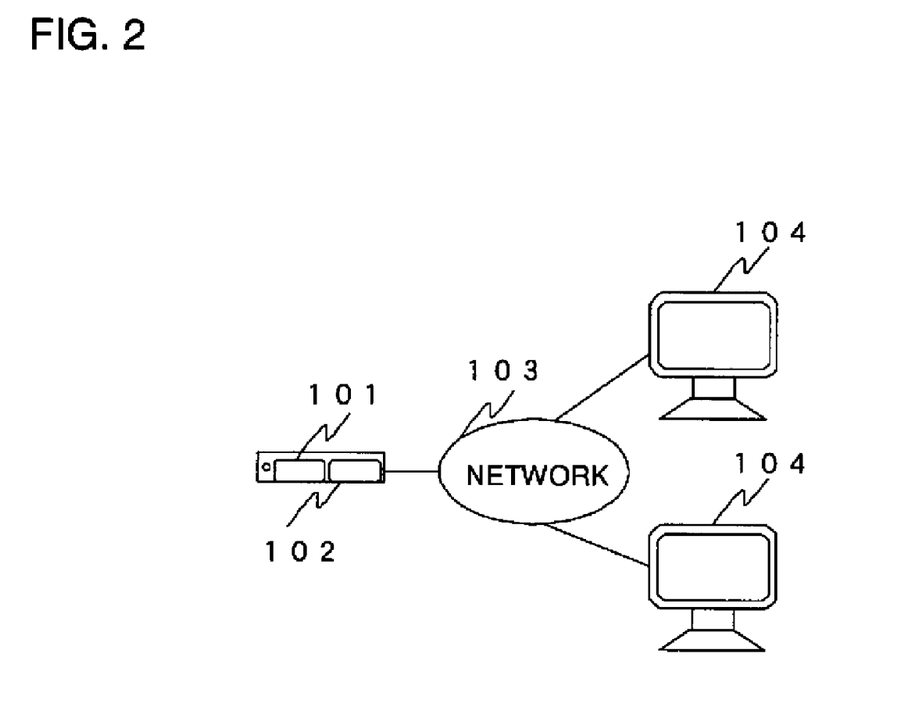
FIG. 2 is a configuration diagram of a system for executing a program according to an exemplary embodiment.

Each processing described above may be realized by having a computer execute a program for designing a scan test circuit. FIG. 2 is a configuration diagram of a system for executing the program of an exemplary embodiment, and a computer device 104 and a server 102 are connected via a network 103. A storage medium 101 is built into the server 102 in order to hold the information of the design program and of each processing. The design program stored in the storage medium 101 is executed by the computer device 104 via the network 103 and designs a semiconductor integrated circuit.

Figure 3:
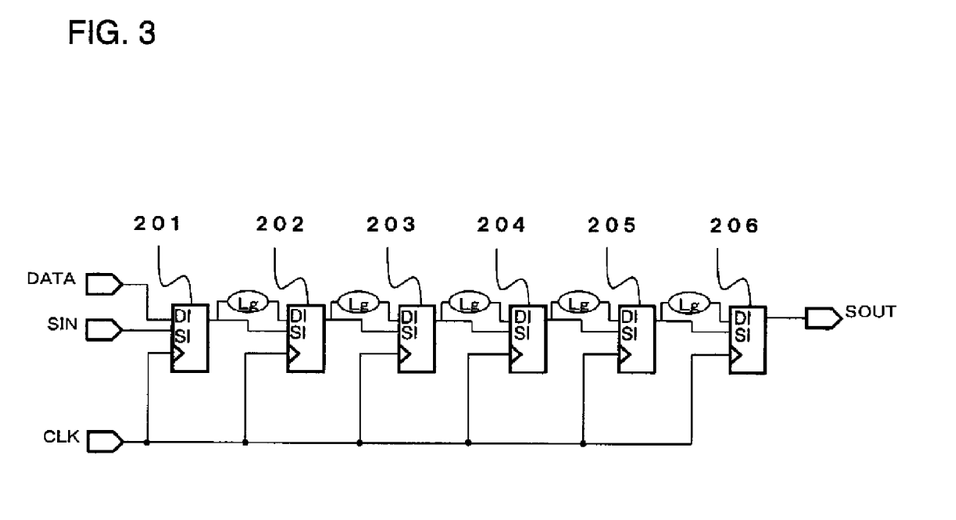
FIG. 3 is a circuit diagram of a scan inserted circuit relating to the first exemplary embodiment.

FIG. 3 is a circuit diagram of an example of a scan inserted circuit D01 created in step S01. The scan inserted circuit D01 shown in FIG. 3 is constituted by six flip-flops 201 to 206, and combination circuits Lg, the test targets, are respectively connected to data input terminals DI of these flip-flops. A scan-in signal SIN is fed to an input terminal SI of the flip-flop 201, and output terminals of the flip-flops 201 to 205 are connected to input terminals SI of the flip-flops 202 to 206 respectively. An output signal SOUT showing the scan test results is outputted from an output terminal of the flip-flop 206. Further, a clock signal CLK is supplied to a clock terminal of each flip-flop.

Figure 4:
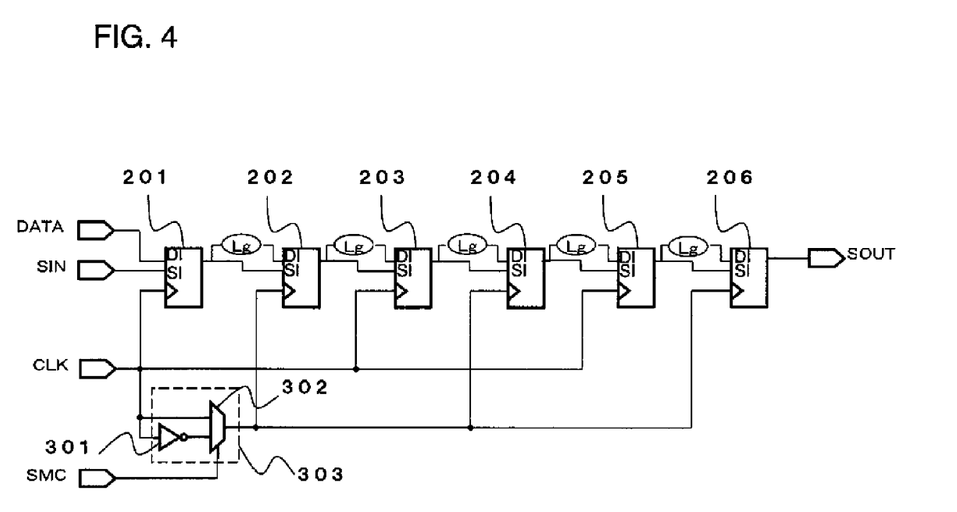
FIG. 4 is a circuit diagram of an inverted clock control circuit inserted circuit relating to the first exemplary embodiment.

FIG. 4 is a circuit diagram of an example of an inverted clock control circuit inserted circuit D03 created in step S02. In FIG. 4, an inverted clock control circuit 303 is added to the scan inserted circuit D01. The clock signal CLK is supplied to the clock terminals of the flip-flops 201, 203, and 205, and the clock terminals of the flip-flops 202, 204, and 206 are connected to an output of the inverted clock control circuit 303. The inverted clock control circuit 303 comprises an inverter 301 and a selector 302, supplies the signal obtained by having the inverter 301 invert the clock signal CLK and the clock signal CLK to the selector 302, and selects and outputs either signal according to a signal SMC that sets the operation mode.

The operation of the inverted clock control circuit 303 will be described. During normal operation and the scan capture operation, i.e., when the SMC signal is at "0" level, the selector 302 selects and outputs the clock signal CLK. During the scan shift operation, i.e., when the SMC signal is at "1" level, the selector 302 selects and outputs the signal that has passed through the inverter 301, which inverts the polarity of the clock signal CLK. In other words, in the operation of the inverted clock control circuit inserted circuit D03, the flip-flops 201 to 206 operate with the normal clock signal (the positive-phase clock signal) during the normal operation and the scan capture operation. On the other hand, during the scan shift operation, the flip-flops 201, 203, and 205 operate with the normal clock signal, and the flip-flops 202, 204, and 206 operate with the inverted clock signal (the opposite-phase clock signal).

Figure 5:
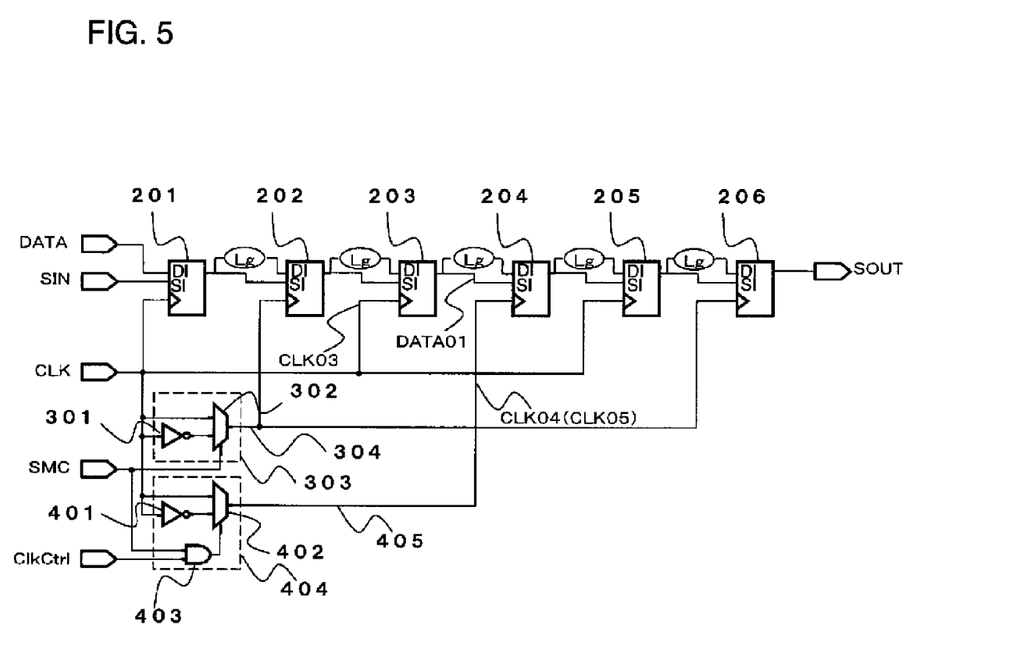
FIG. 5 is a circuit diagram of an example of normal/inverted clock control circuit inserted circuit relating to the first exemplary embodiment.

FIG. 5 is a circuit diagram of an example of a normal/inverted clock control circuit inserted circuit D04 created in step S05. FIG. 5 shows an example of a case where the flip-flop 204 is determined to be in short of sufficient setup time for the scan shift operation in step S04 that determines whether or not there is sufficient setup time for the scan shift operation. In FIG. 5, a normal/inverted clock control circuit 404 is created by further adding an AND circuit 403 to a circuit identical to the inverted clock control circuit 303 shown in FIG. 4.

The normal/inverted clock control circuit 404 comprises an inverter 401, a selector 402, and the AND circuit 403. The AND circuit 403 receives the signal SMC and the control signal ClkCtrl, and outputs to a select control terminal of the selector 402. Further, the control signal ClkCtrl can be controlled externally. The selector 402 receives the signal obtained by having the inverter 401 invert the clock signal CLK and the clock signal CLK, selects either signal according to the logical conjunction of the signal SMC and the control signal ClkCtrl, and outputs an normal/inverted clock signal 405.

The operation of the normal/inverted clock control circuit 404 will be described. When the ClkCtrl signal is at "1," the selector 402 selects the clock signal CLK and outputs it as the normal/inverted clock signal 405 during the normal operation and the scan capture operation, i.e., when the SMC signal is at "0" level. During the scan shift operation, i.e., when the SMC signal is at "1" level, the selector 402 selects the signal that has passed through the inverter 401, which inverts the polarity of the clock signal CLK, and outputs it as the normal/inverted clock signal 405. On the other hand, when the ClkCtrl signal is at "0," the selector 402 compulsorily outputs the clock signal CLK without changing its polarity as the normal/inverted clock signal 405, regardless of the value of the SMC signal.

The operation of the normal/inverted clock control circuit inserted circuit D04 is shown using an example of a case where the flip-flop 204, one of the flip-flops controlled by the inverted clock signal among the flip-flops 201 to 206 controlled alternately between the clock signal CLK and the inverted clock signal obtained by inverting the clock signal CLK, lacks sufficient setup time. The clock signal CLK is supplied to the clock terminals of the flip-flops 201, 203, and 205, the inverted clock signal 304, which is the output of the inverted clock control circuit 303, is supplied to the clock terminals of the flip-flops 202 and 206, and the normal/inverted clock signal 405, which is the output of the normal/inverted clock control circuit 404, is supplied to the clock terminal of the flip-flop 204.

It should be noted that there may be one or more of flip-flop(s) having no sufficient setup time. In this case, the circuit should be configured so that a clock signal of the same phase as that of the clock signal supplied to the clock terminal of the preceding flip-flop can be supplied to the clock terminal(s) of the flip-flop(s) having no sufficient setup time.

In the above descriptions, the inverted clock control circuit 303 and the normal/inverted clock control circuit 404, which supply the clock signal CLK, correspond to the clock signal supplying unit.

Next, each step in the flowchart in FIG. 1 will be described in detail.

First, the scan circuit, inserted for testing, is created and the data of the scan circuit created are held in a storage medium 101 as the inserted scan circuit information D01 in step S01. Further, scan chain information D02 storing the number of scan chains in the scan circuit created, the connection information of the flip-flops on the scan path, and scan clock information is held in the storage medium 101. The circuit described above and shown in FIG. 3 is a configuration example of the scan inserted circuit D01 stored.

In step S02, after the inserted scan circuit information D01 and the scan chain information D02 are read from the storage medium 101 and the inverted clock control circuit (information) 303 shown in FIG. 4 is inserted in the clock line, a flip-flop controlled by the falling edge is extracted from the scan chain information D02. Then the connection of the clock input of the extracted flip-flop is changed to the inverted clock signal, which is the output of the inverted clock control circuit 303, and the inserted circuit information of inverted clock control circuit D03 is created and outputted to the storage medium 101.

Next, in step S03, the inserted circuit information of the inverted clock control circuit D03 is read and the timing verification is performed.

In step S04, whether or not the setup time for the scan shift operation is sufficient is determined, and if it is sufficient, the processing proceeds to step S06.

When there is at least one flip-flop having no sufficient setup time for the scan shift operation in step S04, the normal/inverted clock control circuit (information) 404 shown in FIG. 5 in which both the normal clock signal and the inverted clock signal can be externally controlled is inserted in step 505. Subsequently, the connection of the clock input of the flip-flop having no sufficient setup time for the scan shift operation is changed from the inverted clock signal 304, which is the output of the inverted clock control circuit 303, to the normal/inverted clock signal 405, which is the output of the normal/inverted clock control circuit (information) 404. Further, ClkCtrl control signal information D05, which is switching information ("0" when, at the inserted circuit (information) of the normal/inverted clock control circuit D04, the normal/inverted clock signal 405 is forced to be the normal clock signal, and "1" at any other time), is created and outputted to the storage medium 101, and the layout processing is performed in step S06.

In the scan circuit designed as described, the flip-flops 201 to 206 operate with the normal clock signal during the normal operation and the scan capture operation. Further, during the scan shift operation, the flip-flops 201, 203, and 205 operate with the normal clock signal, whereas the flip-flops 202 and 206 operate with the inverted clock signal. The flip-flop 204 is operated by the normal clock signal or the inverted clock signal selected according to the value of the ClkCtrl signal.

Next, in step S07, the ClkCtrl control signal information D05 is read and the timing verification is executed.

In step S08, whether or not the setup time for the scan shift operation is sufficient is determined according to the results of the timing verification, and when it is sufficient (Yes), the circuit design processing ends. When the setup time for the scan shift operation is insufficient (No), the ClkCtrl control signal information D05 is changed (updated) in step S09 so that the normal clock signal takes over the control, and the updated ClkCtrl control signal information D05 is outputted, reaching end of the circuit design processing.

In the design method described above, a flip-flop having no sufficient setup time is extracted based on the results of the timing analysis on the inverted clock control inserted circuit that is in the half-cycle operation during the scan shift operation, and the process (step S05) of inserting the normal/inverted clock control circuit for the extracted flip-flop is added. Because of this added process, the scan test circuit capable of controlling both the half-cycle operation and the one-cycle operation is created.

The scan test circuit designed as described above is in the half-cycle operation during the scan shift operation and is able to switch the operation of only a particular flip-flop from the half-cycle operation to the one-cycle operation when the particular flip-flop lacks sufficient setup time. This scan test circuit is able to solve the problem heretofore that the speed of the scan shift operation of the entire scan test circuit can be increased only to the extent that the setup time will not be insufficient. This fact will be described more in detail.

Figure 6A:
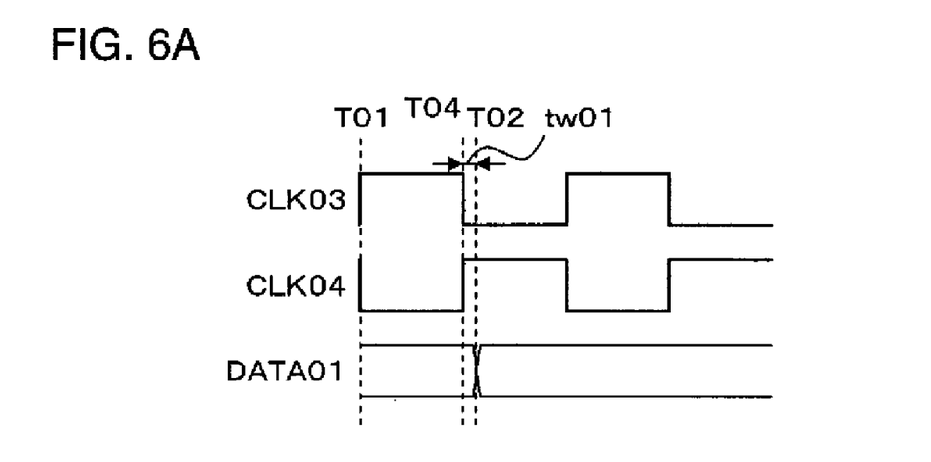
FIGS. 6A and 6B are timing charts showing an example of operation of the normal/inverted clock control circuit inserted circuit.
Figure 6B:
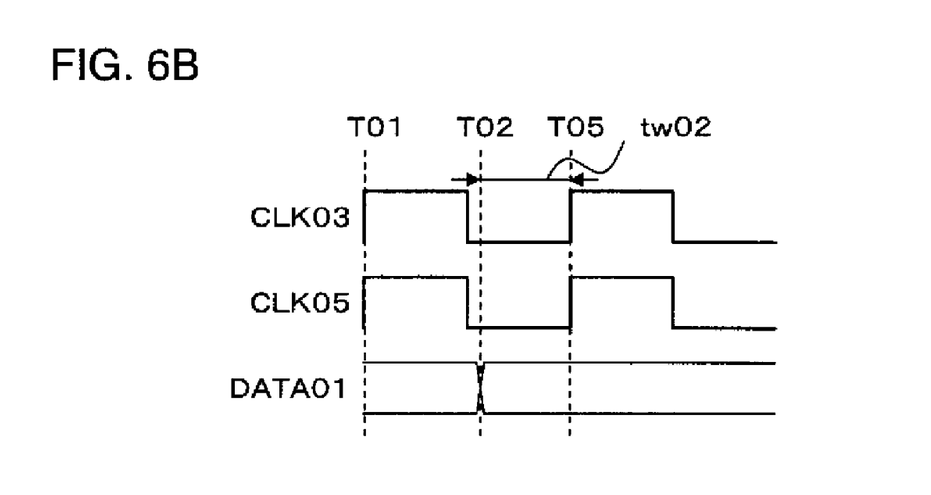

FIGS. 6A and 6B are timing charts showing the operation of the circuit shown in FIG. 5. In FIGS. 5, 6A, and 6B, a clock signal CLK05 corresponds to a clock signal CLK04 with its polarity inverted.

As shown in FIG. 6A, during the half-cycle operation, a data signal DATA01 is outputted at timing T01, the rising edge of a clock signal CLK03 of the flip-flop 203 in the normal/inverted clock control circuit inserted circuit D04, the data signal DATA01 changes at timing T02, and the data signal DATA01 is received at timing T04, at a rising edge of the clock signal CLK04 of the flip-flop 204. In this case, if a setup time of period tw01 is insufficient, the data signal DATA01 that has changed at the timing T02 cannot be received at the timing T04, the rising edge of the clock signal CLK04 of the flip-flop 204.

On the other hand, as shown in FIG. 6B, switching from the half-cycle operation to the one-cycle operation changes the timing at which the data signal DATA01 that has changed at the timing T02 is received from the timing T04 of the rising edge of the clock signal CLK04 of the flip-flop 204 to timing T05, the rising edge of CLK05. In other words, in the half-cycle operation, the setup time of the period tw01 is insufficient, however, switching to the one-cycle operation adds a margin of a half cycle's worth of setup time and obtains a margin of a setup time of period tw02. In this case, the flip-flop 204 operates at low speed. However, it is not necessary to decrease the speed of the scan shift operation of the other flip-flops, and the operation speed can be increased. As a result, the speed of the scan shift operation can be increased further for the entire scan test circuit, compared to the conventional technology.

As described, as long as the flip-flop controlled by the inverted clock control circuit requires more setup time than the margin of the setup time obtained by switching from the half-cycle operation to the one-cycle operation, the operation speed can be increased.

Concrete values are used to describe the example above (the values used are merely an example and actual numbers are not limited to these values). Let us assume that timing verification is performed at a scan shift operation speed of 100 MHz (note that the interior operates at 200 MHz in the half-cycle operation), and that the flip-flop 204 lacks a setup time of 1 ns. In the conventional technology, the scan shift operation can only be performed at up to 83.33 MHz (=1/12 ns).

In the present example, a margin of the setup time is obtained by switching from the half-cycle operation to the one-cycle operation, and the circuit can operate at 100 MHz as a scan test circuit. Further, let us assume that the flip-flops, other than the flip-flop 204, controlled by the inverted clock control circuit are able to operate at up to 250 MHz. In other words, the speed of the scan shift operation can be 125 MHz when a margin of the setup time is obtained inside by switching from the half-cycle operation to the one-cycle operation, the circuit can operate at 100 MHz as a scan test circuit, and the flip-flops, other than the flip-flop 204, controlled by the inverted clock control circuit are able to operate at up to 250 MHz (the internal half-cycle operation speed).

The time required for the scan shift operation is generally expressed by the "scan chain length"× the "cycle." In the conventional technology, 6×6 ns=36 ns. On the other hand, in the present example, since the scan chain length is 5 in the half-cycle operation and 1 in the one-cycle operation, the time required for the scan shift operation is 5×4 ns+1×8 ns=28 ns. In other words, the speed in the present example is approximately 1.3 times as fast as that in the conventional technology.

Exemplary Embodiment 2

Figure 7:
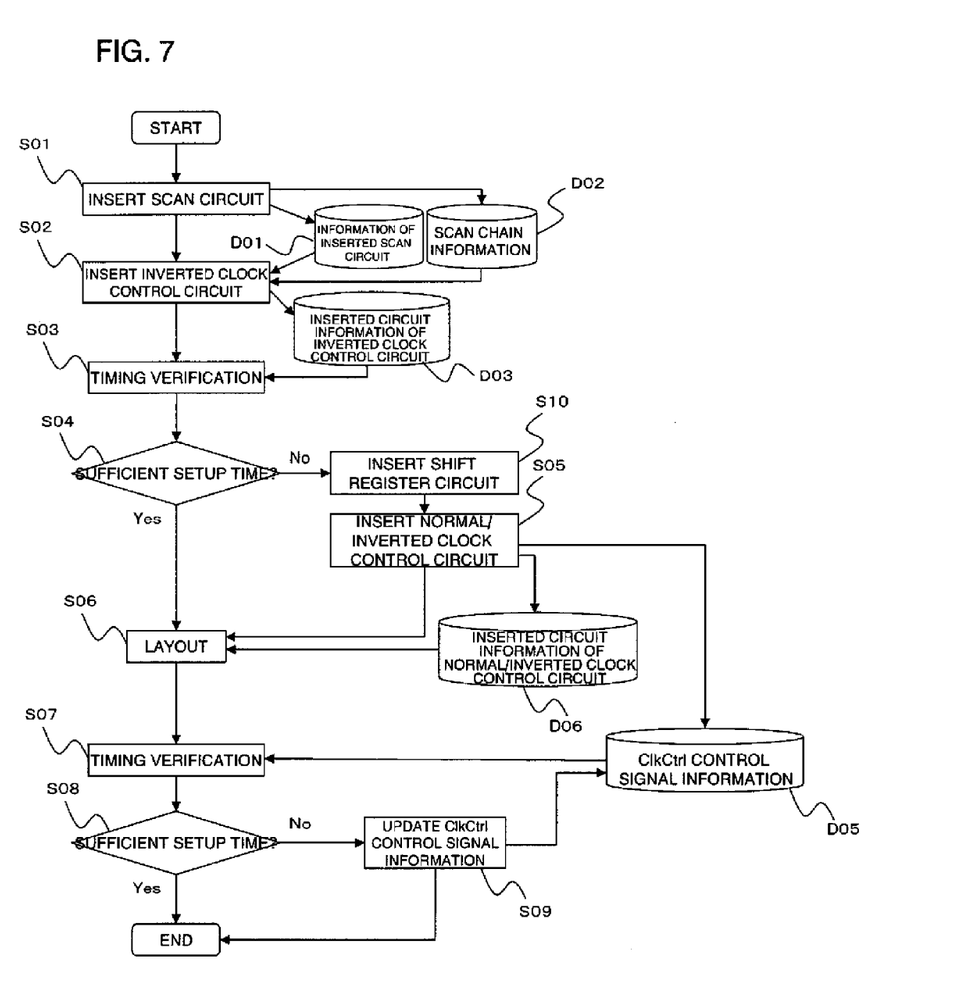
FIG. 7 is a flowchart showing a scan test circuit design method relating to a second exemplary embodiment.

FIG. 7 is a flowchart showing a scan test circuit design method relating to a second exemplary embodiment. This is an example of a design method in which there is a plurality of flip-flops having no sufficient setup time in the flip-flop group of the scan test circuit. In FIG. 7, each step except for step S10 is identical to the corresponding step in FIG. 1, and the explanation of them will be omitted.

When there is a plurality of flip-flops having no sufficient setup time in step S04 in FIG. 7, a shift register circuit for controlling the inverted/normal clock control circuit is inserted in step S10.

Figure 8:
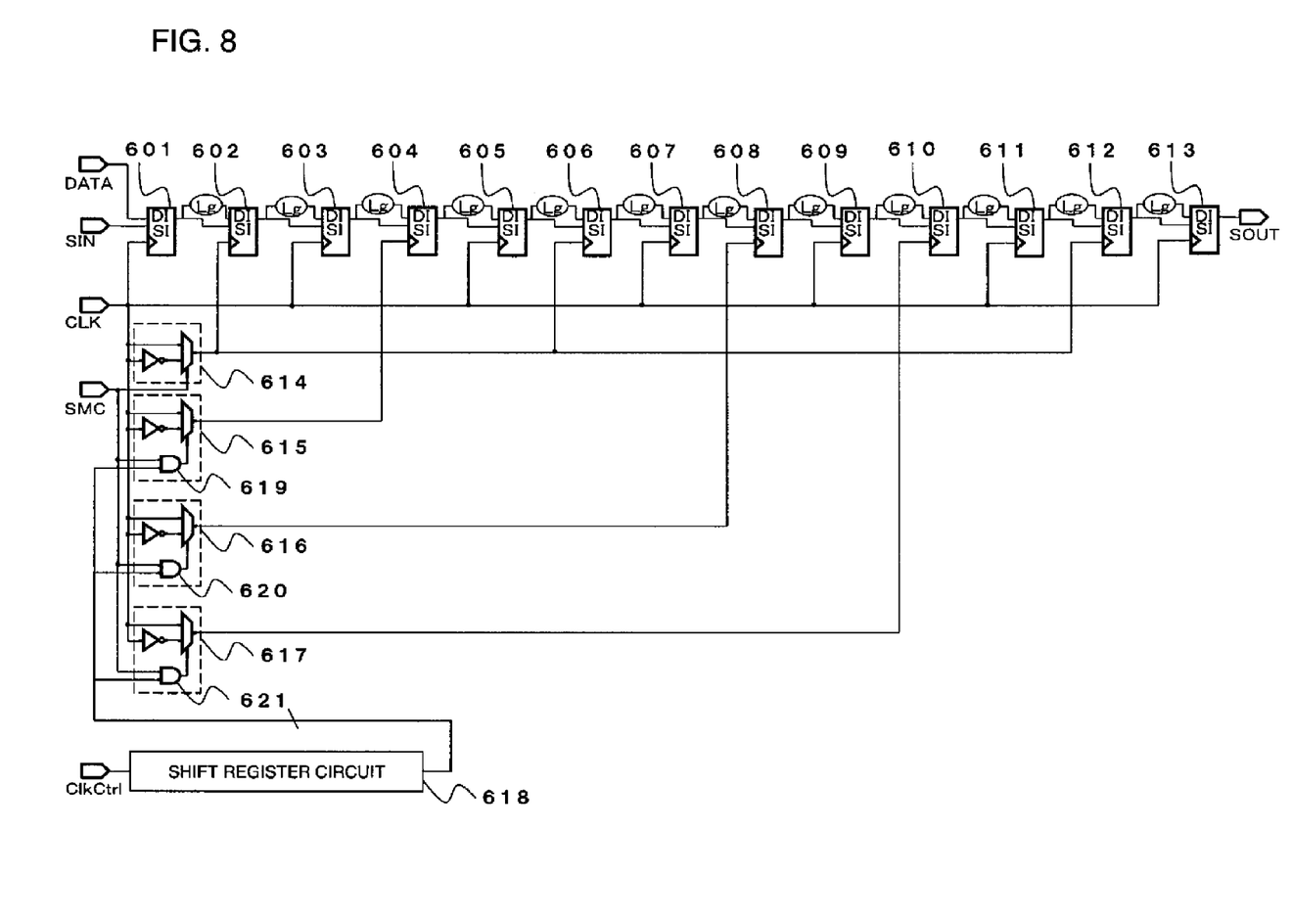
FIG. 8 is a circuit diagram of an example of normal/inverted clock control circuit inserted circuit relating to the second exemplary embodiment.

FIG. 8 is a circuit example of a normal/inverted clock control circuit inserted circuit D06 in a case where it is determined that there are three flip-flops having no sufficient setup time. In FIG. 8, the normal/inverted clock control circuit-inserted circuit D06 comprises cascade-connected flip-flops 601 to 613, an inverted clock control circuit 614, normal/inverted clock control circuits 615, 616, and 617, and a shift register circuit 618.

The inverted clock control circuit 614 is identical to the inverted clock control circuit 303 in FIG. 5, and the normal/inverted clock control circuits 615, 616, and 617 are identical to the normal/inverted clock control circuit 404 in FIG. 5.

Clock terminals of the flip-flops 601, 603, 605, 607, 609, 611, and 613 are connected to the clock signal CLK, and clock terminals of the flip-flops 602, 606, and 612 are connected to an output of the inverted clock control circuit 614. Further, a clock terminal of the flip-flop 604 is connected to an output of the normal/inverted clock control circuit 615, a clock terminal of the flip-flop 608 is connected to an output of the normal/inverted clock control circuit 616, and a clock terminal of the flip-flop 610 is connected to an output of the normal/inverted clock control circuit 617 respectively. AND circuits 619, 620, and 621 built into the normal/inverted [clock] control circuits 615, 616, and 617, respectively, are controlled by clock selection information respectively outputted from the shift register circuit 618. Further, the shift register circuit 618 is configured so as to be able to externally set the clock selection information via the ClkCtrl terminal.

In the scan test circuit of the present exemplary embodiment, when there is a plurality of flip-flops having no sufficient setup time, the clock selection information for these flip-flops held by the shift register circuit 618 in advance is supplied from the shift register circuit 618 in parallel. Therefore, the scan test circuit can be configured without increasing the terminals of the semiconductor device, except for the terminal for the ClkCtrl signal for serially setting the clock selection information for the shift register circuit 618.

The each disclosure of the above-mentioned Patent Documents is incorporated herein by reference thereto. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A scan test circuit comprising:
 a scan path shift register comprising adjacent flip-flops; and
 a clock signal supplying unit configured to scan shift clock signals shifted by a half cycle to each of two adjacent said flip-flops constituting said shift register, and of further supplying clock signals shifted by a cycle to each of at least a pair of adjacent flip-flops of said flip-flops, during a shift mode operation,
 wherein said clock signal supplying unit is configured so as to alternately supply a clock signal having a positive phase and a clock signal having an opposite phase to each of said flip-flops, and of further supplying a clock signal having the same phase to at least three consecutive flip-flops of said flip-flops.

2. The scan test circuit as defined in claim 1, wherein said clock signal supplying unit comprises a shift register that holds determination data determining whether the clock signal supplied to said flip-flops has a positive phase or an opposite phase thereof, and controls supply of the clock signal based on said held determination data.

3. The scan test circuit as defined in claim 2, wherein said shift register is configured so that said determination data can be set externally.

4. The scan test circuit as defined in claim 1, wherein said clock signal supplying unit is configured as to be capable of supplying a clock signal having the same phase to each of said flip-flops during sample mode operation.

5. A method for implementing a scan test circuit comprising a computer device executing the steps of:
 inserting scan test circuit defining a scan path shift register constituted by plural flip-flops with a test target (Lg) connected to data input terminals (DI) of each two adjacent flip-flops, a scan-in signal (SIN) being fed to an input terminal (SI) of a first flip-flop 201, output terminals of the flip-flops being connected to input terminals (SI) of an adjacent downstream flip-flops respectively, an output signal (SOUT) of a final flip-flop providing a scan test result;
 configuring a clock signal supplying unit so as to supply scan shift clock signals shifted by a half cycle to each of the two adjacent flip-flops constituting the scan path shift register;
 confirming whether or not said flip-flops have sufficient setup time during a scan shift operation to identify a flip-flop whose setup time is insufficient;
 inserting a normal/inverted clock control circuit that generates a clock signal adapted to control shift operation of a flip-flop of which said setup time is insufficient; and with the inverted clock control circuit, changing a control clock signal for the scan circuit so as to control alternately between normal and inverted clock signals and replacing the control clock signal for the flip-flop of which said setup time is insufficient with an output of said normal/inverted clock control circuit.

6. The method for implementing a scan test circuit as defined in claim 5, comprising a further step after said step of inserting a shift register that holds control information for said normal/inverted clock control circuit before replacing said control signal in a case where there is a plurality of flip-flops of which said setup time is insufficient when said confirmation is made.

7. The method for implementing a scan test circuit as defined in claim 6, further comprising performing timing verification again after a layout of said scan test circuit has been completed, and modifying the output of said normal/inverted clock control circuit based on the results of said timing verification.

8. The method for implementing a scan test circuit as defined in claim 5, comprising the further steps of:
 confirming a timing of the scan path shift register after the inverted clock control circuit to provide a timing confirmation result;
 determining whether a setup time is sufficient or insufficient according to the timing confirmation result; and
 when the setup time is insufficient according to the timing confirmation result, again inserting the inverted/normal clock control circuit to change control of the scan test circuit with insufficient setup time over to a third clock signal.

9. The method for implementing a scan test circuit as defined in claim 5, comprising the further steps of:
 subsequent to said step of changing over to the third clock signal, performing layout processing and timing confirmation;
 after said step of layout processing, confirming a further setup time;
 determining whether the further setup time is sufficient or insufficient; and
 when said further setup time is determining to be insufficient, updating a ClkCtrl control signal information and performing further timing verification,
 wherein when said further setup time is sufficient, a semiconductor integrated circuit design test is complete.

10. The method for implementing a scan test circuit as defined in claim 5, wherein said clock signal supplying unit is configured so as to alternately supply a clock signal having a positive phase and a clock signal having an opposite phase to each of said flip-flops, and of further supplying a clock signal having the same phase to at least three consecutive flip-flops of said flip-flops.

11. A non-transitory computer readable medium storing thereon a computer readable program when executed by a computer causing the computer to execute a circuit design method comprising the steps of:
 configuring a clock signal supplying unit so as to supply, to a scan path test register comprising adjacent flip-flops, scan shift clock signals shifted by a half cycle to each of two adjacent said flip-flops constituting the scan path shift register;
 confirming whether or not said flip-flops have sufficient setup time during a scan shift operation to identify a flip-flop whose setup time is insufficient; and
 inserting a normal/inverted clock control circuit that generates a clock signal adapted to control shift operation of a flip-flop of which said setup time is insufficient, the inverted clock control circuit changing a control clock signal for the scan circuit so as to control alternately between normal and inverted clock signals and replacing the control signal for the flip-flop of which said setup time is insufficient with an output of said normal/inverted clock control circuit.

12. The non-transitory computer readable medium as defined in claim 11, having the computer execute inserting a shift register that holds control information for said normal/inverted clock control circuit before replacing said control signal in a case where there is a plurality of flip-flops of which said setup time is insufficient when said confirmation is made.

13. The non-transitory computer readable medium as defined in claim 12, having the computer further execute performing timing verification again after the layout of said scan test circuit has been completed, and modifying the output of said normal/inverted clock control circuit based on the results of said timing verification.

14. The non-transitory computer readable medium as defined in claim 11, wherein said clock signal supplying unit is configured so as to alternately supply a clock signal having a positive phase and a clock signal having an opposite phase to each of said flip-flops, and of further supplying a clock signal having the same phase to at least three consecutive flip-flops of said flip-flops.

* * * * *